(12) United States Patent
Huang et al.

(10) Patent No.: US 8,476,705 B2
(45) Date of Patent: Jul. 2, 2013

(54) HIGH VOLTAGE SEMICONDUCTOR DEVICE

(75) Inventors: Hsuehi Huang, Lin-Yuan Township (TW); Yin-Fu Huang, Hsin-Chu (TW); Shih-Chin Lien, Sinjhuang (TW)

(73) Assignee: Macronix International Co., Ltd., Hsinchu (TW)

( * ) Notice: Subject to any disclaimer, the term of this patent is extended or adjusted under 35 U.S.C. 154(b) by 238 days.

(21) Appl. No.: 12/962,702

(22) Filed: Dec. 8, 2010

(65) Prior Publication Data

US 2012/0146139 A1 Jun. 14, 2012

(51) Int. Cl.
*H01L 29/78* (2006.01)

(52) U.S. Cl.
USPC ..... 257/335; 257/336; 257/341; 257/E29.256

(58) Field of Classification Search
USPC .................................................. 257/E29.258
See application file for complete search history.

(56) References Cited

U.S. PATENT DOCUMENTS

| | | | |
|---|---|---|---|
| 2004/0251492 A1* | 12/2004 | Lin | 257/335 |
| 2008/0191272 A1* | 8/2008 | Takeda | 257/330 |

* cited by examiner

*Primary Examiner* — Stephen W Smoot
(74) *Attorney, Agent, or Firm* — Volpe and Koenig, P.C.

(57) ABSTRACT

A semiconductor device for a high voltage application includes a doped source base region, an N+ source region, a P+ source region and a gate structure. The doped source base region has P-type. The N+ source region extends downwards into the doped source base region. The P+ source region is close to the N+ source region, extends downwards into the doped source base region, and is doped heavier than the doped source base region. The gate structure is coupled to the N+ source region and is near to the P+ source region.

19 Claims, 9 Drawing Sheets

HIGH VOLTAGE SEMICONDUCTOR DEVICE

FIELD OF THE INVENTION

The embodiments relate to a high voltage metal oxide semiconductor (HV MOS) device, and more particularly to a laterally double diffused metal oxide semiconductor (LDMOS) device for increasing the safe operation area.

BACKGROUND OF THE INVENTION

Employing a bipolar-CMOS (complementary metal-oxide-semiconductor)-DMOS (double diffused metal-oxide-semiconductor) (hereinafter "BCD") process, a power integrated circuit can be made for the applications in high voltage, high power and high integration density. In the BCD process, a high voltage N-type MOS (HV NMOS), such as a laterally double diffused N-type MOS (LDNMOS) or an extended drain N-type MOS (EDNMOS), is weak in the burn-out test of measuring the safe operation area (SOA).

Figure 1:
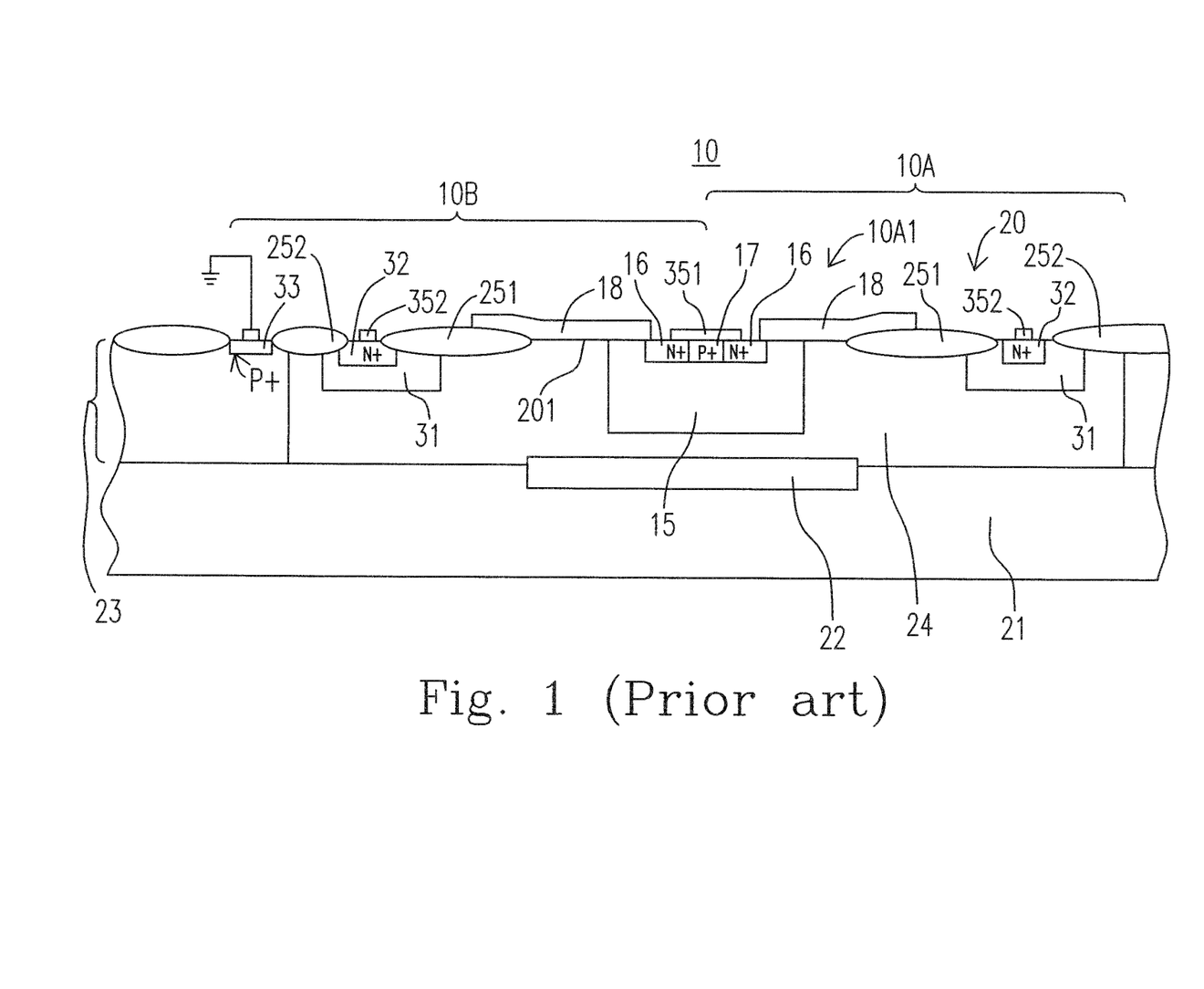
FIG. 1 is a schematic diagram showing a cross-sectional view of a HV LDNMOS device in the prior art.

Please refer to FIG. 1, which is a schematic diagram showing a cross-sectional view of a HV LDNMOS device 10 in the prior art. The HV LDNMOS device 10 includes two LDNMOS transistors 10A and 10B. For the following description, one of the LDNMOS transistors 10A and 10B will be referred although the discussion will refer to each.

The LDNMOS transistor 10A includes a workpiece 20. The workpiece 20 includes a P-doped silicon substrate 21, an N-doped buried layer (NBL) region 22, an epitaxially grown silicon layer 23, a doped high voltage N-well (HV NW) region 24, and field oxide (FOX) isolation regions 251 and 252. The P-doped silicon substrate 21 is provided and overlaid with the NBL region 22 formed by conventional methods. Following the formation of the NBL region 22, the epitaxially grown silicon layer 23 is deposited over the NBL region 22 and the P-doped silicon substrate 21 for formation of various doped regions. For example, following the formation of the epitaxially grown silicon layer 23, ion implantations are carried out to form the doped HV NW region 24 and a LOCOS process is carried out to form the FOX isolation regions 251 and 252.

Subsequent conventional processes are carried out to form a doped NW region 31, a P-doped base region 15, an N+ drain region 32, an N+ source region 16, a P+ base contact region 17 and a P+ substrate bulk region 33 in the workpiece 20. In addition, a gate structure 18, and metal contacts 351 and 352 are formed on an upper surface 201 of the workpiece 20.

Figure 2:
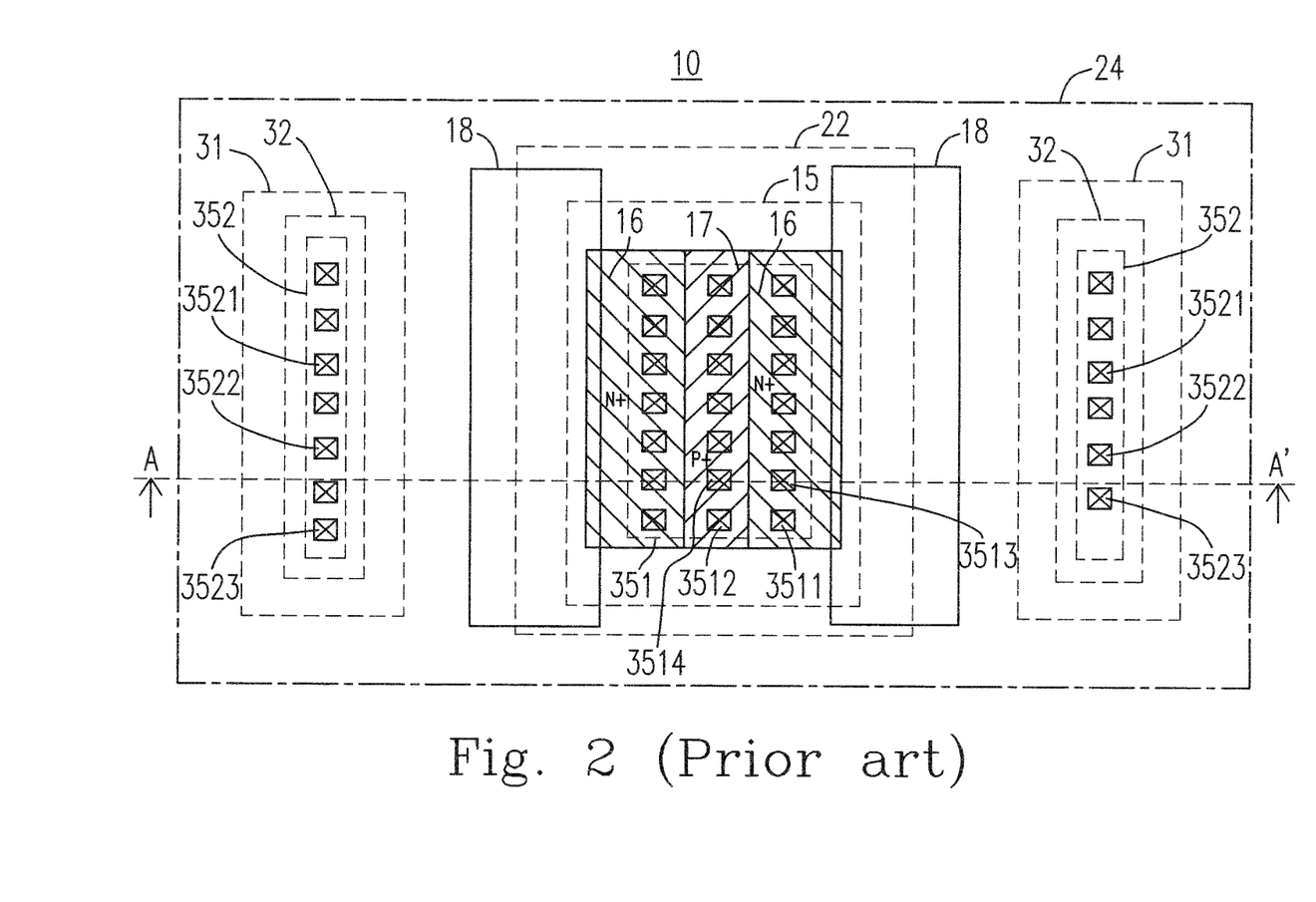
FIG. 2 is a schematic diagram showing a top view of the HV LDNMOS device in FIG. 1.

Please refer to FIG. 2, which is a schematic diagram showing a top view of the HV LDNMOS device 10 in FIG. 1. The cross-sectional view in FIG. 1 is obtained from the cross section located at the cut line A-A' in FIG. 2. As shown in FIG. 2, the metal contact 351 including a plurality of portions 3511, 3512, 3513, ..., 3514 connects the N+ source region 16 to the P+ base contact region 17 for forming a source terminal. The metal contact 352 including a plurality of portions 3521, 3522, ..., 3523 is connected to the N+ drain region 32 for forming a drain terminal. The P+ base contact region 17 is disposed between two N+ source regions 16. The gate structure 18 is disposed on the workpiece 20.

Figure 3:
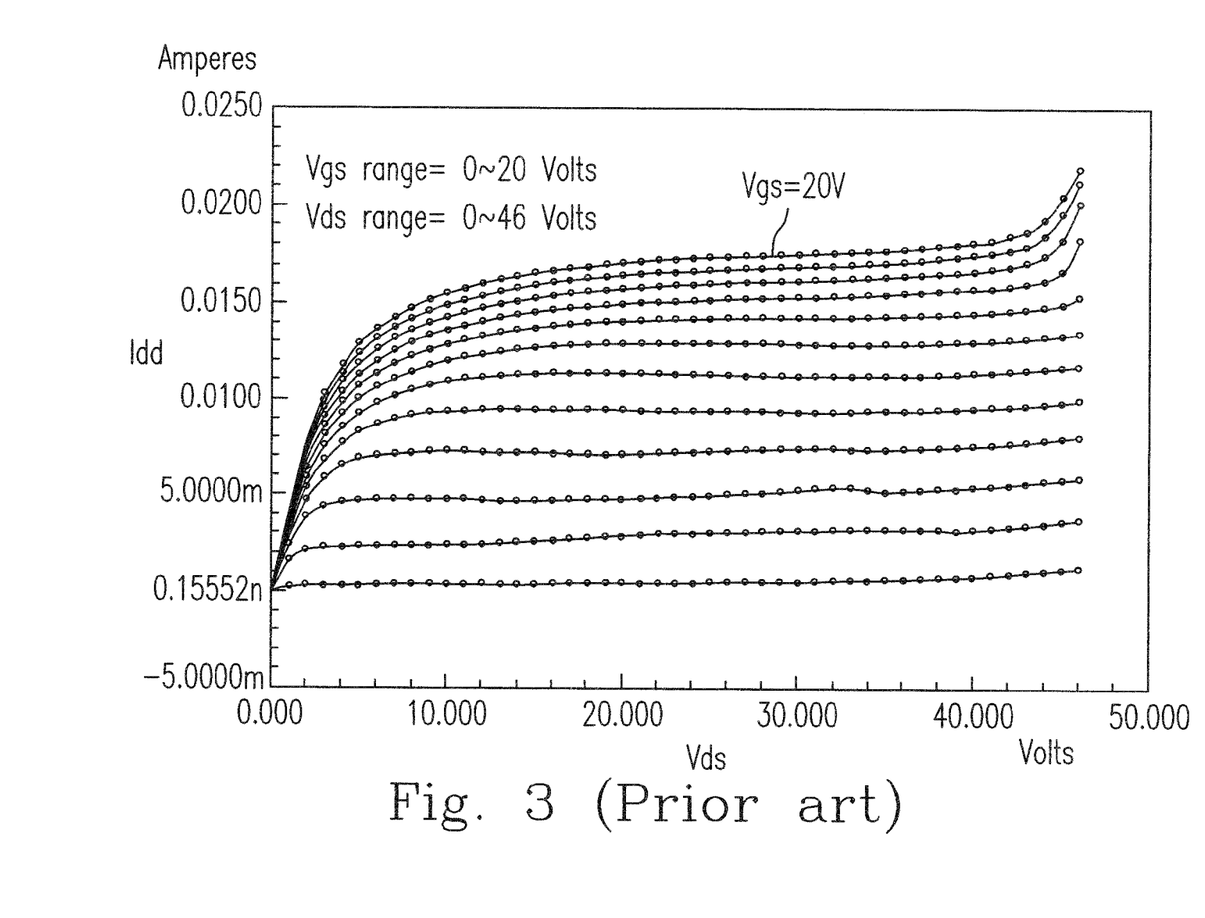
FIG. 3 and FIG. 4 are schematic diagrams showing a first transistor performance and a second transistor performance of the HV LDNMOS device in FIG. 1, respectively.
Figure 4:
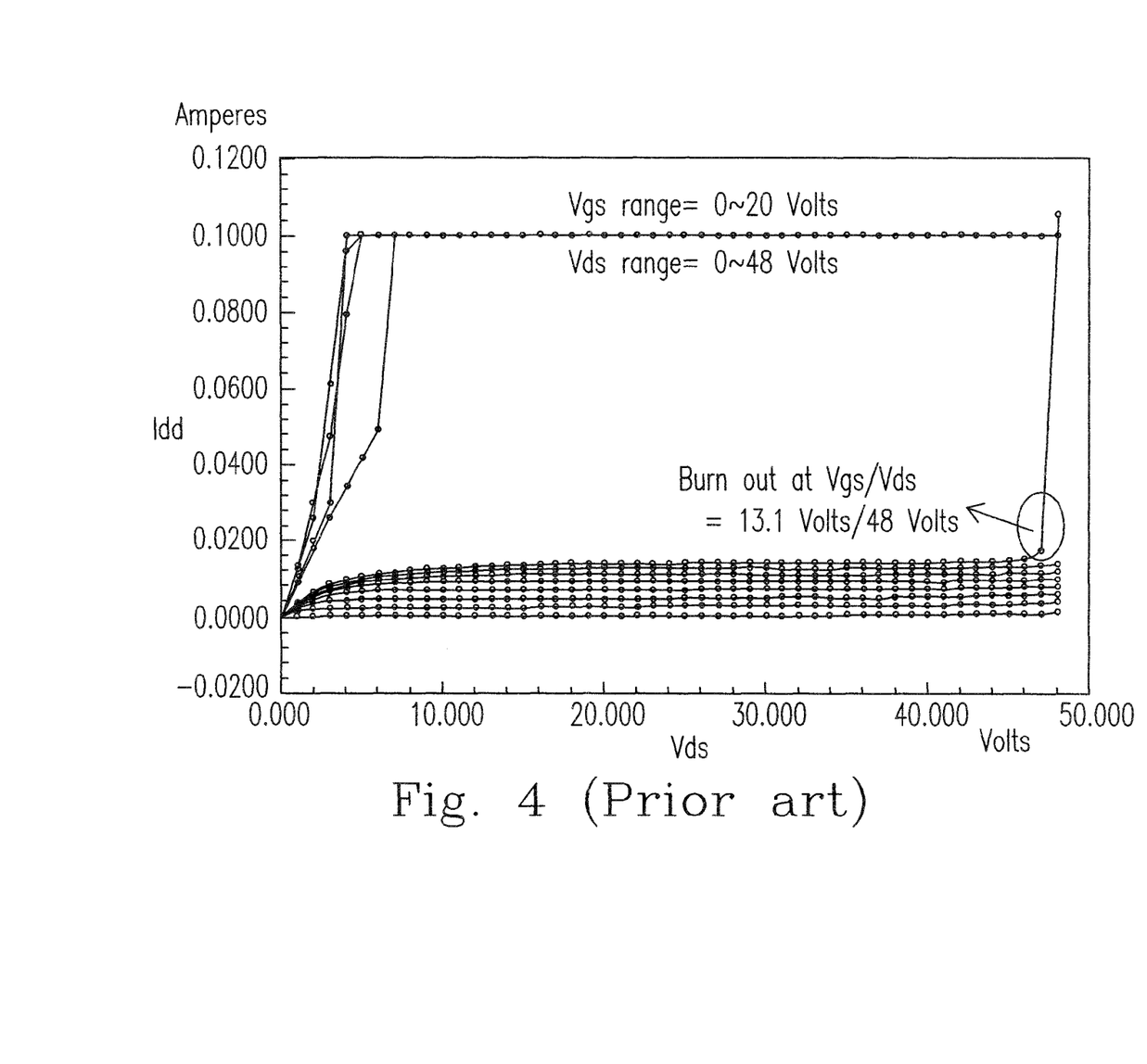

Please refer to FIG. 3 and FIG. 4, which are schematic diagrams showing a first transistor performance and a second transistor performance of the HV LDNMOS device 10 in FIG. 1, respectively. FIG. 3 shows a graph of the drain-source current Idd in Amperes (the y axis) tested over a range of the drain-source voltage Vds from 0 to 47 Volts (the x axis) in a condition that a range of the gate-source voltage Vgs is stepwise changed from 2 to 20 Volts at a voltage interval 1.6364 Volts, wherein the HV LDNMOS device 10 is configured as a circuit including the LDNMOS transistors 10A and 10B connected in parallel.

FIG. 4 shows a graph of the drain-source current Idd in Amperes (the y axis) tested over a range of the drain-source voltage Vds from 0 to 48 Volts (the x axis) in a condition that a range of the gate-source voltages Vgs is stepwise changed from 2 to 20 Volts at a voltage interval 1.6364 Volts, wherein the HV LDNMOS device 10 is the same as that for FIG. 3. The HV LDNMOS device 10 burns out at the operation point that the gate-source voltage Vgs and the drain-source voltage Vds are equal to 13.1 Volts and 48 Volts respectively. In view of FIG. 3 and FIG. 4, the SOA of the HV LDNMOS device 10 may has the characteristics: the safe operation range of the gate-source voltage Vgs is from 0 to 20 Volts, and the safe operation range of the drain-source voltage Vds is from 0 to 47 volts.

The HV LDNMOS device 10 has additional characteristics: the on-resistance Ron is 98 mΩ-mm2 at the operation point that the gate-source voltage Vgs and the drain-source voltage Vds are equal to 5 volts and 0.2 volts respectively; the threshold voltage is 1.39 Volts; the zero gate voltage drain current Ioff is 27 pA; the drain-source breakdown voltage Vbd is 58.7 Volts, which is the drain-source voltage at the operation point that the gate-source voltage Vgs and the drain current Idd are equal to 0 and 1 µA respectively; and the saturation drain current Idsat is 18 mA at the operation point that the gate-source voltage Vgs and the drain-source voltage Vds are equal to 20 Volts and 40 Volts respectively.

The HV LDNMOS device 10 can be used in power electronic applications such as the LCD driver, the power conversion and the consumer audio. The high voltage stress and the high current stress often occur in the switching circuits of these applications. Therefore, it is necessary to further improve the SOA of the HV LDNMOS device 10.

SUMMARY OF THE INVENTION

It is an object of the embodiments to widen the SOA of the HV LDNMOS device by lowering the base resistance of the parasitic bipolar junction transistor thereof and the hot-hole current crowding thereof.

It is therefore an aspect of the embodiments to provide a semiconductor device. The semiconductor device includes a doped source base region, an N+ source region, a P+ source region and a gate structure. The doped source base region has P-type. The N+ source region extends downwards into the doped source base region. The P+ source region is close to the N+ source region, extends downwards into the doped source base region, and is doped heavier than the doped source base region. The gate structure is coupled to the N+ source region and is near to the P+ source region.

It is therefore another aspect of the embodiments to provide a semiconductor device. The semiconductor device includes a doped source base region, an N+ source region, a P+ source region and a gate structure. The doped source base region has P-type. The N+ source region is disposed in the doped source base region. The P+ source region is close to the N+ source region, disposed in the doped source base region, and doped heavier than the doped source base region. The gate structure is near to the P+ source region.

It is still another aspect of the embodiments to provide a semiconductor device. The semiconductor device includes a doped source base region, a P+ source region, an N+ source region and a gate structure. The doped source base region has N-type. The P+ source region is disposed in the doped source base region. The N+ source region is close to the P+ source region, disposed in the doped source base region, and doped heavier than the doped source base region. The gate structure is near to the N+ source region.

BRIEF DESCRIPTION OF THE DRAWINGS

The foregoing and other features and advantages of the embodiments will be more clearly understood through the following descriptions with reference to the drawings, wherein.

DETAIL DESCRIPTION OF THE PREFERRED EMBODIMENT

The embodiments will now be described more specifically with reference to the following embodiments. It is to be noted that the following descriptions of preferred embodiments are presented herein for the purposes of illustration and description only; it is not intended to be exhaustive or to be limited to the precise form disclosed.

The embodiments will be described with respect to preferred embodiments in a specific context, namely a high voltage double diffused MOS (HV DMOS) device. Embodiments may also be applied, however, to other transistor structures and methods of fabrication thereof. While two transistors are shown in each figure, there may be many transistors formed simultaneously on a single semiconductor workpiece (not shown). In accordance with the embodiments, although an N-channel semiconductor device is described herein, a P-channel semiconductor device may be applied by correspondingly replacing N-type and P-type in the N-channel semiconductor device with P-type and N-type respectively.

Figure 5:
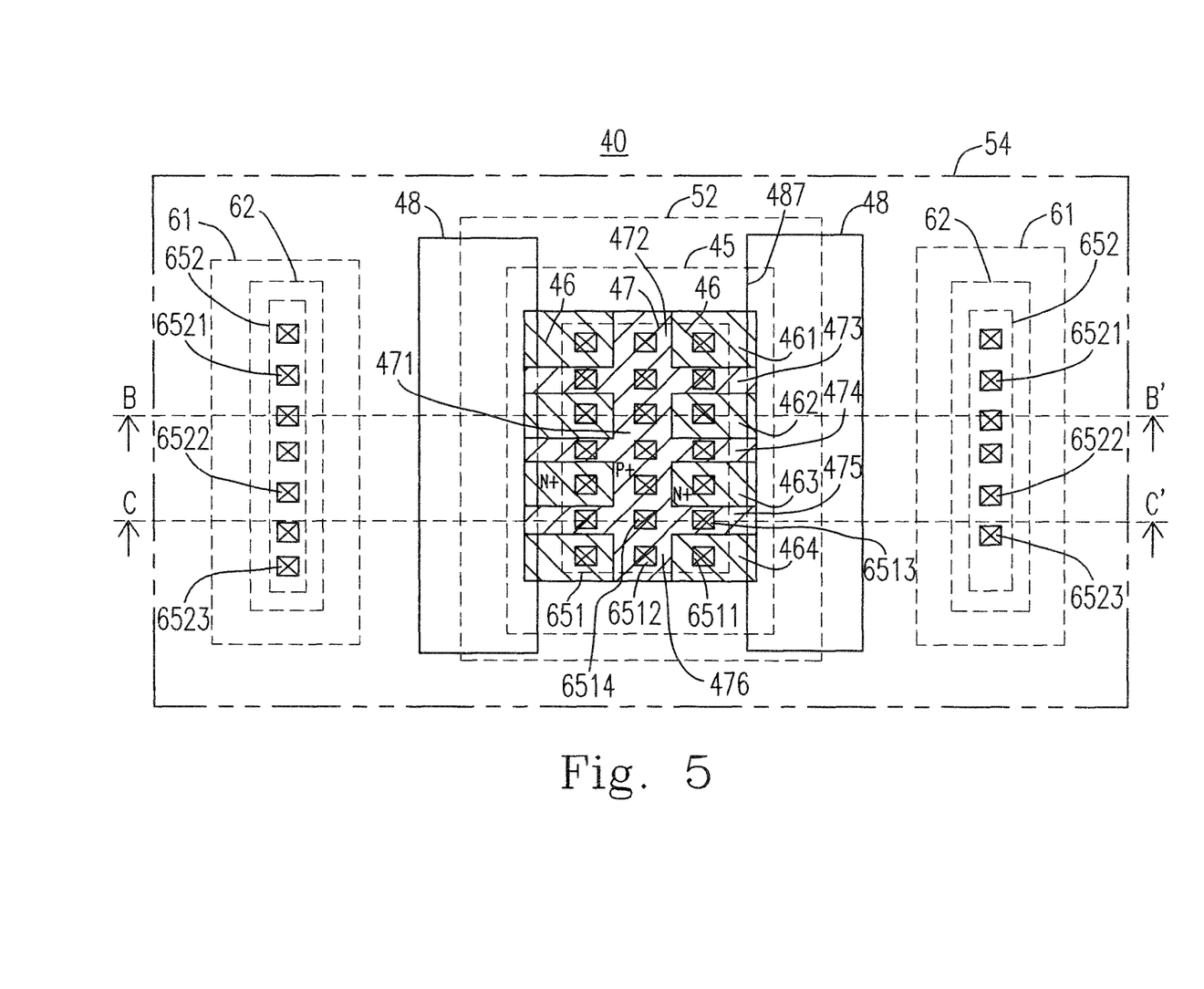
FIG. 5 is a schematic diagram showing a top view of a semiconductor device according to the first embodiment of the present invention.
Figure 6:
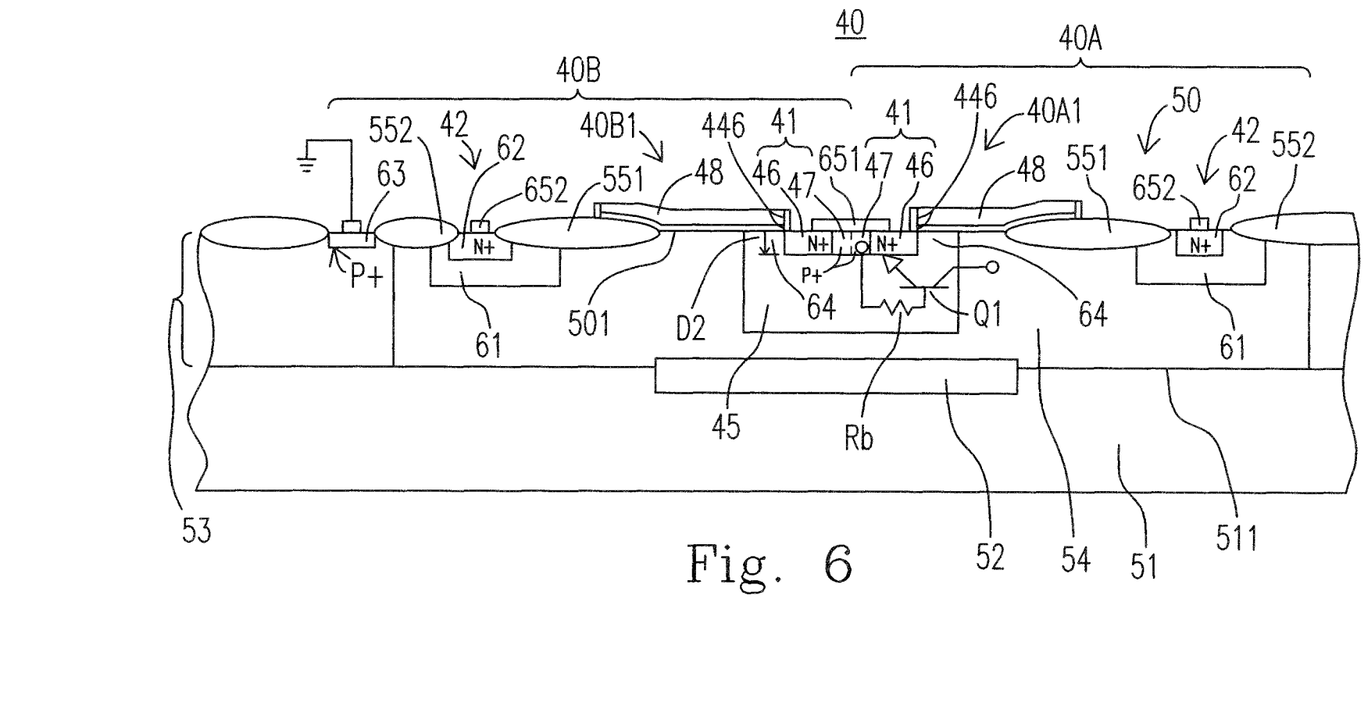
FIG. 6 and FIG. 7 are schematic diagrams showing a first cross-sectional view and a second cross-sectional view of the semiconductor device in FIG. 5, respectively.
Figure 7:
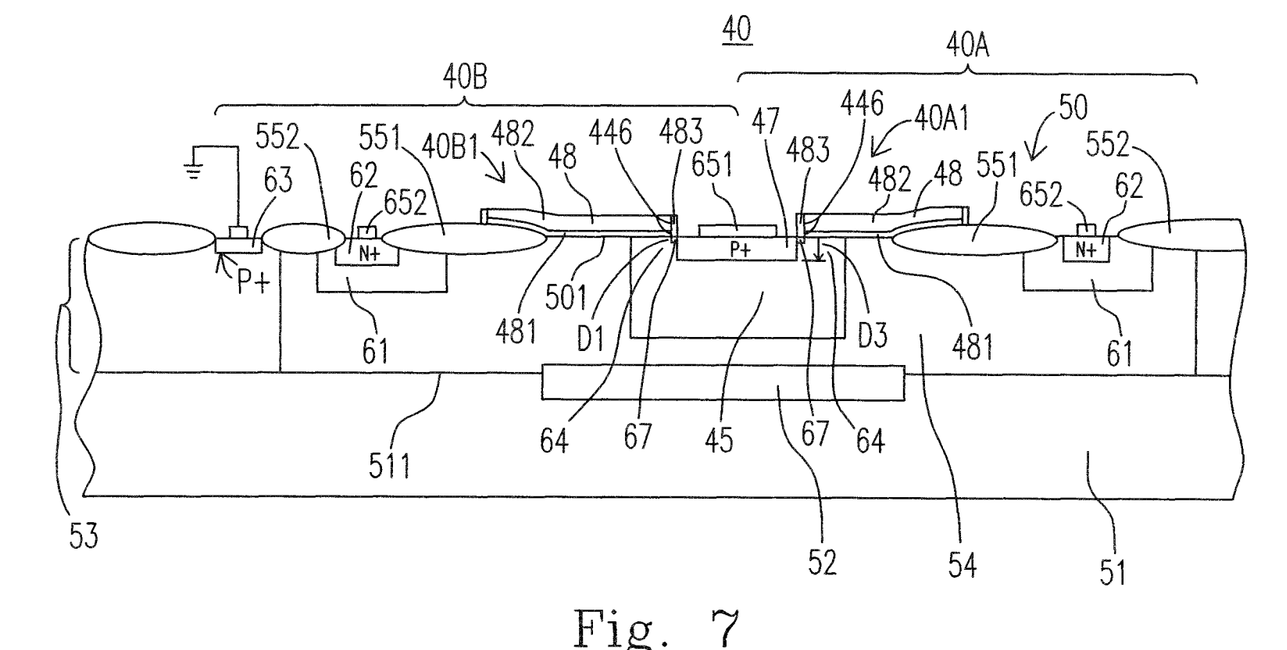

Please refer to FIG. 5, FIG. 6 and FIG. 7. FIG. 5 is a schematic diagram showing a top view of a semiconductor device 40 according to the first embodiment. FIG. 6 and FIG. 7 are schematic diagrams showing a first cross-sectional view and a second cross-sectional view of the semiconductor device 40 in FIG. 5, respectively. The first cross-sectional view in FIG. 6 is obtained from the cross section located at the cut line B-B' in FIG. 5, and the second cross-sectional view in FIG. 7 is obtained from the cross section located at the cut line C-C' in FIG. 5. As shown in FIG. 5, FIG. 6 and FIG. 7, the semiconductor device 40 includes two semiconductor devices 40A and 40B such as two transistors. For the following description, one of the semiconductor devices 40A and 40B will be referred although the discussion will refer to each.

In one embodiment, the semiconductor device 40A includes a doped source base region 45, an N+ source region 46, a P+ source region 47 and a gate structure 48. For example, the semiconductor devices 40A and 40B include N-type transistors 40A1 and 40B1, respectively. The N-type transistor 40A1 includes the doped source base region 45, the N+ source region 46, the P+ source region 47 and the gate structure 48. The doped source base region 45 has P-type. The N+ source region 46 is disposed in the doped source base region 45. The P+ source region 47 is close to the N+ source region, is disposed in the doped source base region 45, and is doped heavier than the doped source base region 45. The gate structure 48 is near to the P+ source region 47.

In one embodiment, the semiconductor device 40A includes the doped source base region 45, the N+ source region 46, the P+ source region 47 and the gate structure 48. The doped source base region 45 has P-type. The N+ source region 46 extends downwards into the doped source base region 45. The P+ source region 47 is close to the N+ source region, extends downwards into the doped source base region 45, and is doped heavier than the doped source base region 45. The gate structure 48 is coupled to the N+ source region 46 and is near to the P+ source region 47.

In one embodiment, the semiconductor device 40A includes a workpiece 50 having an upper surface 501. The workpiece 50 further includes a semiconductor substrate 51, a doped region 52, an epitaxial semiconductor layer 53, a drift region 54 and isolation regions 551 and 552. The semiconductor substrate 51 has P-type and a surface 511. The doped region 52 has N-type, and extends downwards from the surface 511. For example, the doped region 52 is an N-doped buried layer 521. The epitaxial semiconductor layer 53 has P-type and the upper surface 501, and extends upwards from the surface 511.

The drift region 54 has N-type, and extends downwards from the upper surface 501 into the epitaxial semiconductor layer 53. For example, the drift region 54 may be a high voltage N-well. For example, the doped source base region 45 extends downwards from the upper surface 501 into the drift region 54, and may be a double diffused region. For example, the doped source base region 45 extends downwards from the upper surface 501 into the epitaxial semiconductor layer 53 and is adjacent to the drift region 54. The N+ source region 46 and the P+ source region 47 extend downwards from the upper surface 501 into the doped source base region 45. The isolation regions 551 and 552 are disposed in the workpiece 50.

In one embodiment, the semiconductor device 40A further includes a doped region 61, an N+ drain region 62, a substrate bulk region 63, a channel region 64 and metal contacts 651 and 652. The doped region 61 has N-type, and extends downwards from the upper surface 501 into the drift region 54. For example, the doped region 61 may be an N-well. The N+ drain region 62 extends downwards from the upper surface 501 into the doped region 61, and is doped heavier than the doped region 61. The substrate bulk region 63 has P-type, extends downwards from the upper surface 501 into the epitaxial semiconductor layer 53, and is doped heavier than the epitaxial semiconductor layer 53. The channel region 64 is disposed in the doped source base region 45, beneath the gate structure 48, and between the N+ source region 46 and the N+ drain region 62. The metal contact 651 including a plurality of portions 6511, 6512, 6513, . . . , 6514 connects the N+ source region 46 to the P+ source region 47 for forming a source terminal. The metal contact 652 including a plurality of portions 6521, 6522, . . . , 6523 is connected to the N+ drain region 62 for forming a drain terminal.

The isolation region 551 is disposed in the drift region 54 and between the gate structure 48 and the N+ drain region 62.

The isolation region 551 includes one of a field oxide region 5511 and a shallow trench isolation region (not shown). The gate structure 48 is disposed on the upper surface 501, and covers the channel region 64. The N-type transistor 40A1 includes the gate structure 48, a source 41, and a drain 42. The source 41 may include the N+ source region 46 and the P+ source region 47. For example, the P+ source region 47 may be used to allow good contact to the doped source base region 45. The drain 42 may include the doped region 61 and the N+ drain region 62. The N-type transistor 40A1 may be one selected from a group consisting of a laterally double diffused MOS transistor device, an extended drain MOS transistor device, a double diffused drain MOS transistor device and a low voltage MOS transistor device. For example, the operating drain-source voltage of the low voltage MOS transistor device is less than 12 Volts.

In one embodiment, the gate structure 48 includes a gate dielectric layer 481, a gate electrode layer 482 and a dielectric spacer 483. The gate dielectric layer 481 is disposed on the upper surface 501. The gate electrode layer 482 covers the gate dielectric layer 481, wherein the gate dielectric layer 481 and the gate electrode layer 482 have a sidewall 446. The dielectric spacer 483 is formed on the sidewall 446, and is coupled to the N+ source region 46 and is near to the P+ source region 47. For example, the gate electrode layer 482 may includes a polysilicon material. In one embodiment, the gate structure 48 covers at least one of a portion of the N+ source region 46 and a portion of the P+ source region 47. For example, the dielectric spacer 483 covers at least one of the portion of the N+ source region 46 and the portion of the P+ source region 47. In one embodiment, the gate structure 48 abuts at least one of a portion of the N+ source region 46 and a portion of the P+ source region 47. For example, the dielectric spacer 483 abuts at least one of the portion of the N+ source region 46 and the portion of the P+ source region 47.

In one embodiment, after the formation of the gate dielectric layer 481, the gate electrode layer 482 is formed. After the formation of the gate electrode layer 482, the N+ source region 46 is formed. After the formation of the N+ source region 46, the P+ source region 47 is formed. After the formation of the P+ source region 47, the dielectric spacer 483 is formed. In one embodiment, the N-type conductivity type and the P-type conductivity type in the semiconductor device 40A may be replaced respectively with P-type conductivity type and N-type conductivity type to form a P-type semiconductor transistor device.

In one embodiment, the semiconductor device 40A further includes a lightly doped region 67. The lightly doped region 67 extends downwards from the upper surface 501 into the doped source base region 45, and underlies the gate structure 48. For example, the lightly doped region 67 may include an N-type lightly doped drain (NLDD) region. For example, the lightly doped region 67 may include a P-type lightly doped drain (PLDD) region. For example, the lightly doped region 67 may include a PLDD region and an NLDD region. In one embodiment, the lightly doped region 67 abuts the dielectric spacer 483. The N+ source region 46 and the P+ source region 47 extend through the lightly doped region 67, and are doped heavier than the lightly doped region 67.

In one embodiment, after the formation of the gate dielectric layer 481, the gate electrode layer 482 is formed. After the formation of the gate electrode layer 482, the lightly doped region 67 is formed. After the formation of the lightly doped region 67, the dielectric spacer 483 is formed. After the formation of the dielectric spacer 483, the N+ source region 46 is formed. After the formation of the N+ source region 46, the P+ source region 47 is formed.

In one embodiment, the lightly doped region 67 has a depth D1, the N+ source region 46 has a depth D2, and the P+ source region 47 has a depth D3. For example, each of the depths D2 and D3 is greater than the depth D1. For example, the depth D3 may be greater than or matched with the depth D2. In one embodiment, the dosages of the semiconductor substrate 51, the doped region 52, the drift region 54, the doped source base region 45, the doped region 61, the N+ source region 46 and the P+ source region 47 may be in the orders of $10^{12}$, $10^{13}$~$10^{14}$, $10^{11}$~$10^{12}$, $10^{13}$, $10^{12}$~$10^{13}$, $10^{15}$ and $10^{15}$ ions/cm$^3$, respectively.

As shown in FIG. 5, FIG. 6 and FIG. 7, the N+ source region 46 includes a plurality of source sub-regions 461, 462, 463 and 464. The P+ source region 47 includes a base sub-region 471 and a plurality of salient sub-regions 472, 473, 474, 475 and 476 aligned laterally from the base sub-region 471. Each of the plurality of source sub-regions 461, 462, 463 and 464 is disposed between two of the plurality of salient sub-regions 472, 473, 474, 475 and 476. In one embodiment, the gate structure 48 has an edge 487 traversing the N+ source region 46 and the P+ source region 47. For example, the dielectric spacer 483 has the edge 487.

In the semiconductor device 40A, the N+ source region 46, the doped source base region 45 and the drift region 54 form an NPN parasitic bipolar junction transistor (BJT) Q1 having a base, and there is a base resistance Rb between the metal contact 651 and the base of the NPN parasitic BJT Q1. The base resistance Rb may be formed from the P+ source region 47 and the doped source base region 45. In FIG. 1 and FIG. 2, the P+ base contact region 17 is disposed between two N+ source regions 16. In FIGS. 5, FIGS. 6 and 7, the gate structure 48 is coupled to the N+ source region 46 and is near to the P+ source region 47. Compared with the LDNMOS transistor 10A in FIG. 1, the base resistance Rb of the semiconductor device 40A in FIG. 5 can be reduced so as to lower the triggering capability of the NPN parasitic BJT Q1 and relax the current crowing of the hot holes in the doped source base region 45 by using the enlarged P+ source region 47 being near to the gate structure 48. By means of laterally extending the P+ source region 47 to be near to the gate structure 48, the SOA of the semiconductor device 40A could be caused to be wider than that of the LDNMOS transistor 10A.

Figure 8:
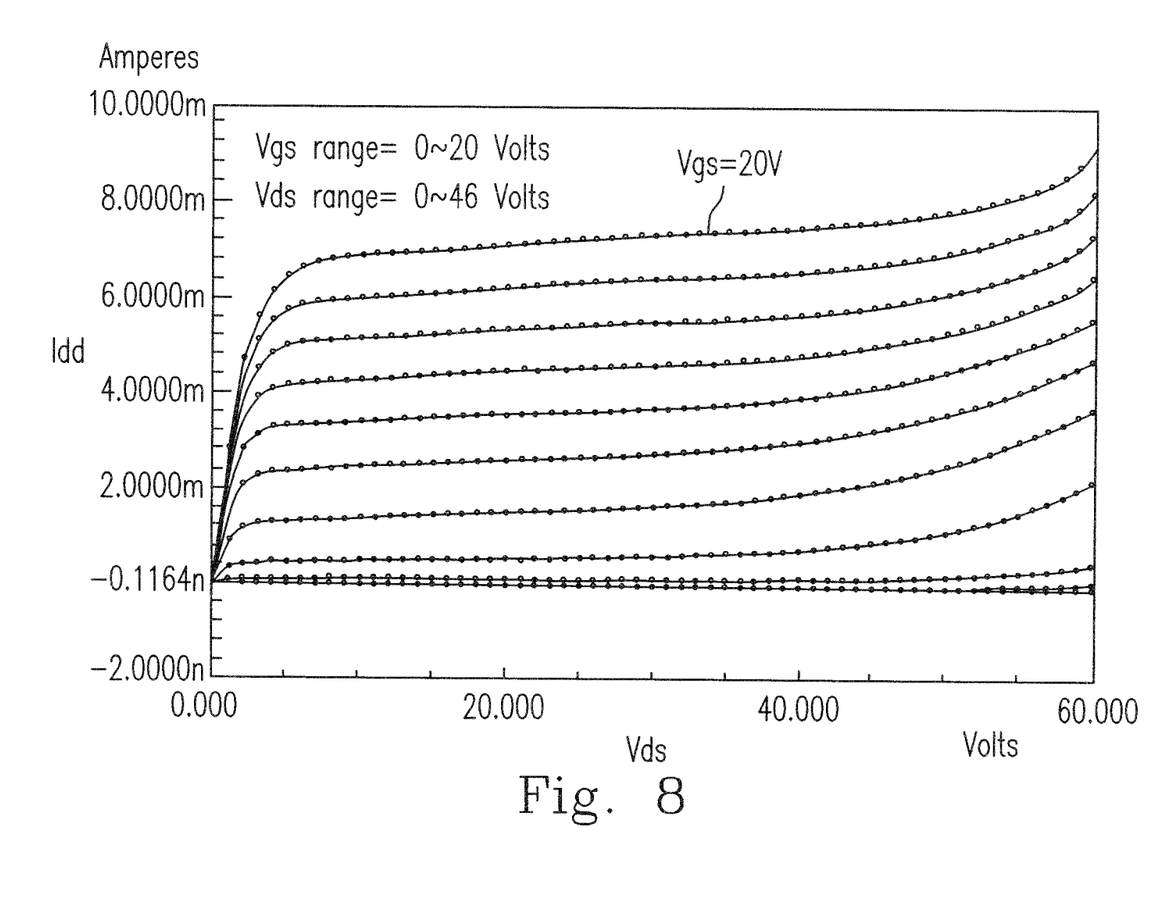
FIG. 8 is a schematic diagram showing a transistor performance of the semiconductor device in FIG. 5.

Please refer to FIG. 8, which is a schematic diagram showing a transistor performance of the semiconductor device 40 in FIG. 5. FIG. 8 shows a graph of the drain-source current Idd in Amperes (the y axis) tested over a range of the drain-source voltage Vds from 0 to 60 Volts (the x axis) in a condition that a range of the gate-source voltage Vgs is stepwise changed from 2 to 20 Volts at a voltage interval 1.6364 Volts, wherein the semiconductor device 40 is configured as a circuit including the semiconductor devices 40A and 40B connected in parallel. In view of FIG. 8, the SOA of the semiconductor device 40 may has the characteristics: the safe operation range (SOA) of the gate-source voltage Vgs is from 0 to 20 Volts, and the safe operation range of the drain-source voltage Vds is from 0 to 60 volts. Comparing the SOA of the semiconductor device 40 with that (Vgs=0~20V, Vds=0~47V) of the LDNMOS transistor 10A, it can be seen that the SOA of the semiconductor device 40A made without adding an extra mask can be wider than that of the LDNMOS transistor 10A.

The semiconductor device 40 has additional characteristics: the on-resistance Ron is 185 mΩ-mm2 at the operation point that the gate-source voltage Vgs and the drain-source voltages Vds are equal to 5 volts and 0.2 volts respectively; the threshold voltage Vth is 1.41 Volts; the zero gate voltage drain current Ioff is 29 pA; the drain-source breakdown voltage Vbd is 58.6 Volts, which is the drain-source voltage at the operation point that the gate-source voltages Vgs and the drain current Idd are equal to 0 and 1 µA respectively; and the saturation drain current Idsat is 7.93 mA at the operation point that the gate-source voltage Vgs and the drain-source voltages Vds are equal to 20 Volts and 40 Volts respectively.

Figure 9:
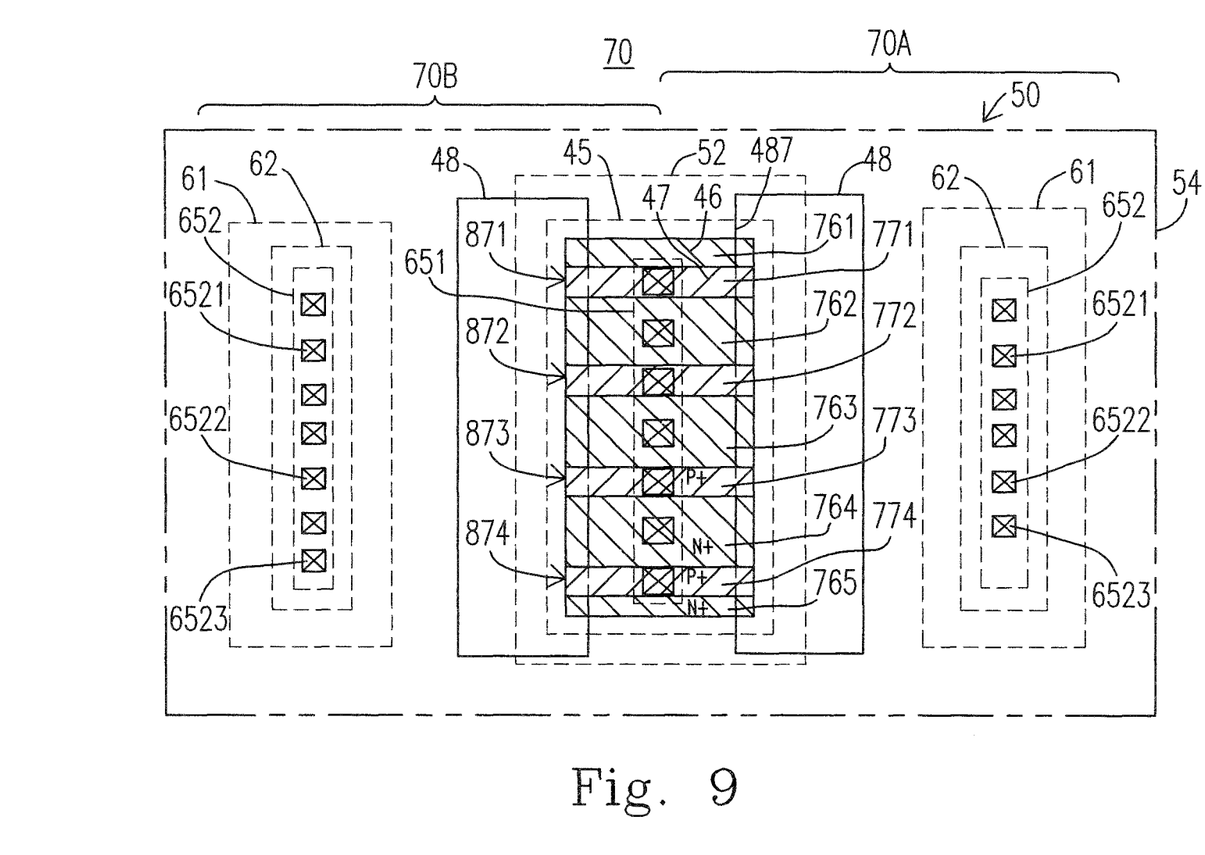
FIG. 9 is a schematic diagram showing a top view of a semiconductor device according to the second embodiment of the present invention.

Please refer to FIG. 9, which is a schematic diagram showing a top view of a semiconductor device 70 according to the second embodiment of the present invention. As shown, the semiconductor device 70 includes two semiconductor devices 70A and 70B. Comparing the embodiment in FIG. 9 with that in FIG. 5, most structures of the devices are similar or the same, so that the descriptions for the portion of the same or similar structures are omitted. In FIG. 9, the semiconductor device 70A includes a doped source base region 45, a N+ source region 46, a P+ source region 47 and a gate structure 48. The gate structure 48 has the edge 487 traversing the N+ source region 46 and the P+ source region 47. The N+ source region 46 includes a plurality of source sub-regions 761, 762, 763, 764 and 765 in a sequence in a direction of the edge 487, and the plurality of source sub-regions 761, 762, 763, 764 and 765 form at least one spacing 871, 872, 873 and 874 therebetween. The P+ source region 47 includes at least one sub-region 771, 772, 773 and 774 disposed in the respective at least one spacing 871, 872, 873 and 874.

The semiconductor device 40A in FIG. 5 and the semiconductor device 70A in FIG. 9 could be used to construct the LDNMOS device or the EDNMOS device in the BCD process. In general, the semiconductor device 40A or 70A serves as a HV NMOS device. The P+ source region 47A in the semiconductor devices 40A for a HV NMOS device would become an N+ source region in a HV PMOS device with the shape the same as that of the P+ source region 47A. The structure in FIG. 5 or FIG. 9 is not restricted to form an LDNMOS device or an EDNMOS device, which has a LOCOS structure or a shallow trench insulation (STI) structure, it can also be applied to a double diffused drain MOS device or a low voltage MOS device to improve the on-breakdown voltage thereof and widen the SOA thereof.

While the embodiments has been described in terms of what is presently considered to be the most practical and preferred embodiments, it is to be understood that the embodiments needs not be limited to the disclosed embodiments. On the contrary, it is intended to cover various modifications and similar arrangements included within the spirit and scope of the appended claims, which are to be accorded with the broadest interpretation so as to encompass all such modifications and similar structures.

What is claimed is:

1. A semiconductor device, comprising:
   a doped source base region having P-type;
   an N+ source region extending downwards into the doped source base region;
   a P+ source region being close to the N+ source region, extending downwards into the doped source base region, and doped heavier than the doped source base region; and
   a gate structure coupled to the N+ source region, and being near to the P+ source region, wherein:
   the N+ source region comprises a plurality of source sub-regions;
   the P+ source region comprises a base sub-region and a plurality of salient sub-regions aligned laterally from the base sub-region; and
   each of the plurality of source sub-regions is disposed between two of the plurality of salient sub-regions.

2. A semiconductor device according to claim 1, further comprising:
   a workpiece having an upper surface;
   a first doped region having N-type, and extending downwards from the upper surface; and
   an N+ drain region extending downwards from the upper surface into the first doped region, and doped heavier than the first doped region;
   a metal contact connecting the N+ source region to the P+ source region, wherein:
   each of the doped source base region, the P+ source region and the N+ source region extends downwards from the upper surface; and
   the gate structure is disposed on the upper surface.

3. A semiconductor device according to claim 2, wherein the workpiece further comprises:
   a semiconductor substrate having P-type and a first surface;
   a second doped region having N-type, and extending downwards from the first surface;
   an epitaxial semiconductor layer having P-type and the upper surface, and extending upwards from the first surface;
   a drift region having N-type, and extending downwards from the upper surface into the epitaxial semiconductor layer; and
   an isolation region disposed in the drift region and between the gate structure and the N+ drain region.

4. A semiconductor device according to claim 3, wherein the isolation region comprises one of a field oxide region and a shallow trench isolation region.

5. A semiconductor device according to claim 3, wherein the first doped region is disposed in the drift region, and the doped source base region is disposed in one of the drift region and the epitaxial semiconductor layer.

6. A semiconductor device according to claim 2, wherein the gate structure comprises:
   a gate dielectric layer disposed on the upper surface;
   a gate electrode layer covering the gate dielectric layer, wherein the gate dielectric layer and the gate electrode layer have a sidewall; and
   a dielectric spacer formed on the sidewall, coupled to the N+ source region, and being near to the P+ source region.

7. A semiconductor device according to claim 2, further comprising:
   a channel region disposed in the doped source base region and between the N+ source region and the N+ drain region; and
   a lightly doped region extending downwards from the upper surface into the doped source base region, and underlying the gate structure, wherein the N+ source region and the P+ source region extend through the lightly doped region, and are doped heavier than the lightly doped region.

8. A semiconductor device according to claim 1, wherein the N+ source region further has a portion, the P+ source region further has a portion, and the gate structure covers at least one of the portion of the N+ source region and the portion of the P+ source region.

9. A semiconductor device according to claim 1, wherein the semiconductor device comprises one selected from a group consisting of a laterally double diffused NMOS device, an extended drain NMOS device, a double diffused drain NMOS device and a low voltage NMOS device.

10. A semiconductor device according to claim 1, wherein:
    the gate structure has an edge traversing the N+ source region and the P+source region;

the N+ source region comprises a plurality of source sub-regions in a sequence in a direction of the edge, and the plurality of source sub-regions form at least one spacing therebetween; and the P+ source region comprises at least one sub-region disposed in the respective at least one spacing.

11. A semiconductor device, comprising:
a doped source base region having P-type;
an N+ source region disposed in the doped source base region;
a P+ source region being close to the N+ source region, disposed in the doped source base region, and doped heavier than the doped source base region; and
a gate structure being near to the P+ source region, wherein:
the N+ source region comprises a plurality of source sub-regions;
the P+ source region comprises a base sub-region and a plurality of salient sub-regions aligned laterally from the base sub-region; and
each of the plurality of source sub-regions is disposed between two of the plurality of salient sub-regions.

12. A semiconductor device according to claim 11, further comprising:
a workpiece having an upper surface;
a first doped region having N-type, and extending downwards from the upper surface;
an N+ drain region extending downwards from the upper surface into the first doped region, and doped heavier than the first doped region; and
a metal contact connecting the N+ source region to the P+ source region.

13. A semiconductor device according to claim 12, wherein:
the doped source base region extends downwards from the upper surface;
the gate structure is disposed on the upper surface;
the N+ source region has a portion, and extends downwards from the upper surface into the doped source base region;
the P+ source region has a portion, and extends downwards from the upper surface into the doped source base region; and
the semiconductor device further comprises one of a first structure and a second structure, wherein the first structure is that the gate structure covers at least one of the portion of the N+ source region and the portion of the P+ source region, and the second structure is that the gate structure abuts at least one of the portion of the N+ source region and the portion of the P+ source region.

14. A semiconductor device according to claim 12, wherein the gate structure comprises:
a gate dielectric layer disposed on the upper surface;
a gate electrode layer covering the gate dielectric layer, wherein the gate dielectric layer and the gate electrode layer have a sidewall; and
a dielectric spacer formed on the sidewall, coupled to the N+ source region, and being near to the P+ source region.

15. A semiconductor device, comprising:
a doped source base region having N-type;
a P+ source region disposed in the doped source base region;
an N+ source region being close to the P+ source region, disposed in the doped source base region, and doped heavier than the doped source base region; and
a gate structure being near to the N+ source region, wherein:
the P+ source region comprises a plurality of source sub-regions;
the N+ source region comprises a base sub-region and a plurality of salient sub-regions aligned laterally from the base sub-region; and
each of the plurality of source sub-regions is disposed between two of the plurality of salient sub-regions.

16. A semiconductor device according to claim 15, further comprising:
a workpiece having an upper surface;
a first doped region having P-type, and extending downwards from the upper surface;
a P+ drain region extending downwards from the upper surface into the first doped region, and doped heavier than the first doped region; and
a metal contact connecting the P+ source region to the N+ source region.

17. A semiconductor device according to claim 16, wherein:
the doped source base region extends downwards from the upper surface;
the gate structure is disposed on the upper surface;
the P+ source region has a portion, and extends downwards from the upper surface into the doped source base region;
the N+ source region has a portion, and extends downwards from the upper surface into the doped source base region; and
the semiconductor device further comprises one of a first structure and a second structure, wherein the first structure is that the gate structure covers at least one of the portion of the P+ source region and the portion of the N+ source region, and the second structure is that the gate structure abuts at least one of the portion of the P+source region and the portion of the N+ source region.

18. A semiconductor device according to claim 16, wherein the gate structure comprises:
a gate dielectric layer disposed on the upper surface;
a gate electrode layer covering the gate dielectric layer, wherein the gate dielectric layer and the gate electrode layer have a sidewall; and
a dielectric spacer formed on the sidewall, coupled to the P+ source region, and being near to the N+ source region.

19. A semiconductor device according to claim 15, wherein the semiconductor device comprises one selected from a group consisting of a laterally double diffused PMOS device, an extended drain PMOS device, a double diffused drain PMOS device and a low voltage PMOS device.

* * * * *